United States Patent
Lim et al.

(10) Patent No.: US 6,937,534 B2
(45) Date of Patent: Aug. 30, 2005

(54) INTEGRATED CIRCUIT MEMORY DEVICE INCLUDING DELAY LOCKED LOOP CIRCUIT AND DELAY LOCKED LOOP CONTROL CIRCUIT AND METHOD OF CONTROLLING DELAY LOCKED LOOP CIRCUIT

(75) Inventors: Jong-hyoung Lim, Suwon (KR); Hui-kyung Sung, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 22 days.

(21) Appl. No.: 10/646,718

(22) Filed: Aug. 25, 2003

(65) Prior Publication Data

US 2004/0174760 A1 Sep. 9, 2004

(30) Foreign Application Priority Data

Mar. 4, 2003 (KR) ................. 10-2003-0013429

(51) Int. Cl.[7] ............................................. G11C 7/00
(52) U.S. Cl. .................. 365/222; 365/194; 365/233
(58) Field of Search ................... 365/222, 194, 365/233

(56) References Cited

U.S. PATENT DOCUMENTS

| 6,342,801 B1 | * | 1/2002 | Shin ........................... 327/175 |
| 6,618,310 B2 | * | 9/2003 | Higashiho et al. .......... 365/222 |
| 6,687,169 B2 | * | 2/2004 | Ryu et al. .................... 365/194 |
| 2002/0051396 A1 | * | 5/2002 | Higashiho et al. .......... 365/222 |
| 2002/0181297 A1 | * | 12/2002 | Jones et al. ................ 365/194 |

FOREIGN PATENT DOCUMENTS

| KR | 2001-0108751 | 8/2001 |
| KR | 1020020036297 | 5/2002 |

OTHER PUBLICATIONS

Korean Office Action dated Oct. 28, 2004, with English translation.

* cited by examiner

Primary Examiner—Huan Hoang
(74) Attorney, Agent, or Firm—Harness, Dickey & Pierce, P.L.C.

(57) ABSTRACT

A DLL power supply of the integrated circuit memory device supplies power to the DLL circuit, and a control signal generator controls the DLL power supply to selectively supply power to the DLL circuit during a refresh mode of the integrated circuit memory device based on a selection signal.

28 Claims, 16 Drawing Sheets

INTEGRATED CIRCUIT MEMORY DEVICE INCLUDING DELAY LOCKED LOOP CIRCUIT AND DELAY LOCKED LOOP CONTROL CIRCUIT AND METHOD OF CONTROLLING DELAY LOCKED LOOP CIRCUIT

BACKGROUND OF THE INVENTION

1. Field of the Invention

The present invention relates to integrated circuit memory devices including a delay locked loop (DLL) circuit.

2. Description of the Related Art

A concern with integrated circuit memory devices is power consumption. One component of an integrated circuit memory device responsible for a significant amount of power consumption is the delay locked loop circuit. Delayed locked loop (DLL) circuits are used, for example, in synchronous dynamic random access memory (SDRAM). This type of DRAM operates in synchronization with an externally applied clock signal. Specifically, the DLL circuit generates an internal clock signal used for synchronization from the externally supplied clock signal.

SDRAM and DRAM in general are types of volatile memory devices—meaning that, over time the charges, which represent logic values, that are stored by capacitors in the memory device leak away. This leaking is caused by parasitic capacitance in the memory device. Consequently, such volatile memory devices perform a refresh operation wherein the charges are refreshed. During the refresh operation, the internal clock signal generated by the DLL circuit is not needed. As a result, a prior art technique for reducing power consumption involves ceasing the supply of power to the DLL circuit during the refresh mode and resetting the DLL circuit.

A DLL circuit includes a phase detector and a variable delay unit. The phase detector detects the phase difference between the external clock signal and a fed back version of the internal clock signal generated by the DLL circuit. The variable delay unit delays the external clock signal by an amount that varies based on the detected phase difference to produce the internal clock signal. When powering up, the DLL circuit typically takes more than 200 clock cycles to lock onto the external clock signal. This means the DLL circuit takes more than 200 clock cycles for the variable delay unit to substantially stabilize the amount of delay in generating the internal clock signal. Because of this, the delay established by the variable delay unit is often referred to as the locking information. When the DLL circuit is reset, such as during the refresh operation, the locking information is lost. More specifically, resetting the DLL circuit causes the variable delay unit to reset to a preprogrammed delay. Consequently, after each refresh operation, more than 200 clock cycles must pass before the DLL circuit locks onto the external clock signal and begins generating an appropriate internal clock signal. As such it takes more than 200 clock cycles after each refresh operation before the memory device can begin further operation.

Frequent refresh operations may, therefore, degrade the performance of the semiconductor memory device. Also, the power consumed during the more than 200 clock cycle lock operation may off-set any reductions in power consumption achieved by ceasing the supply of power to the DLL circuit and resetting the DLL circuit during the refresh operation.

SUMMARY OF THE INVENTION

In the memory device of the present invention, a control signal generator selectively supplies power to the DLL circuit during a refresh mode of operation. In one exemplary embodiment, whether the control signal generator supplies power to the DLL circuit is based on a selection signal.

In an exemplary embodiment, the selection signal is generated based on a mode register set command received by the memory device. In another exemplary embodiment, the selection signal is an externally supplied signal. In a further embodiment, a fuse circuit of the memory device is programmable to generate the selection signal during the refresh mode.

In a still further embodiment, first and second decoders are provided. The first decoder decodes a first refresh command to generate a refresh mode indication signal indicating whether the memory device is in the refresh mode. The second decoder decodes a second refresh command to generate a second internal refresh signal indicating whether to supply power to the DLL circuit during the refresh mode.

In yet another embodiment, an oscillator of the memory device that generates the oscillating signal for sequentially enabling word lines of the memory device during the refresh operation also generates the selection signal such that the control signal generator cuts power to the DLL circuit a period of time after beginning generation of the oscillating signal for the refresh operation.

In another embodiment of the present invention, combinable with any of the above-mentioned embodiments, the control signal generator controls the DLL circuit to selectively reset the locking information during the refresh mode based on the selection signal.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DESCRIPTION OF THE PREFERRED EMBODIMENTS

Figure 1:
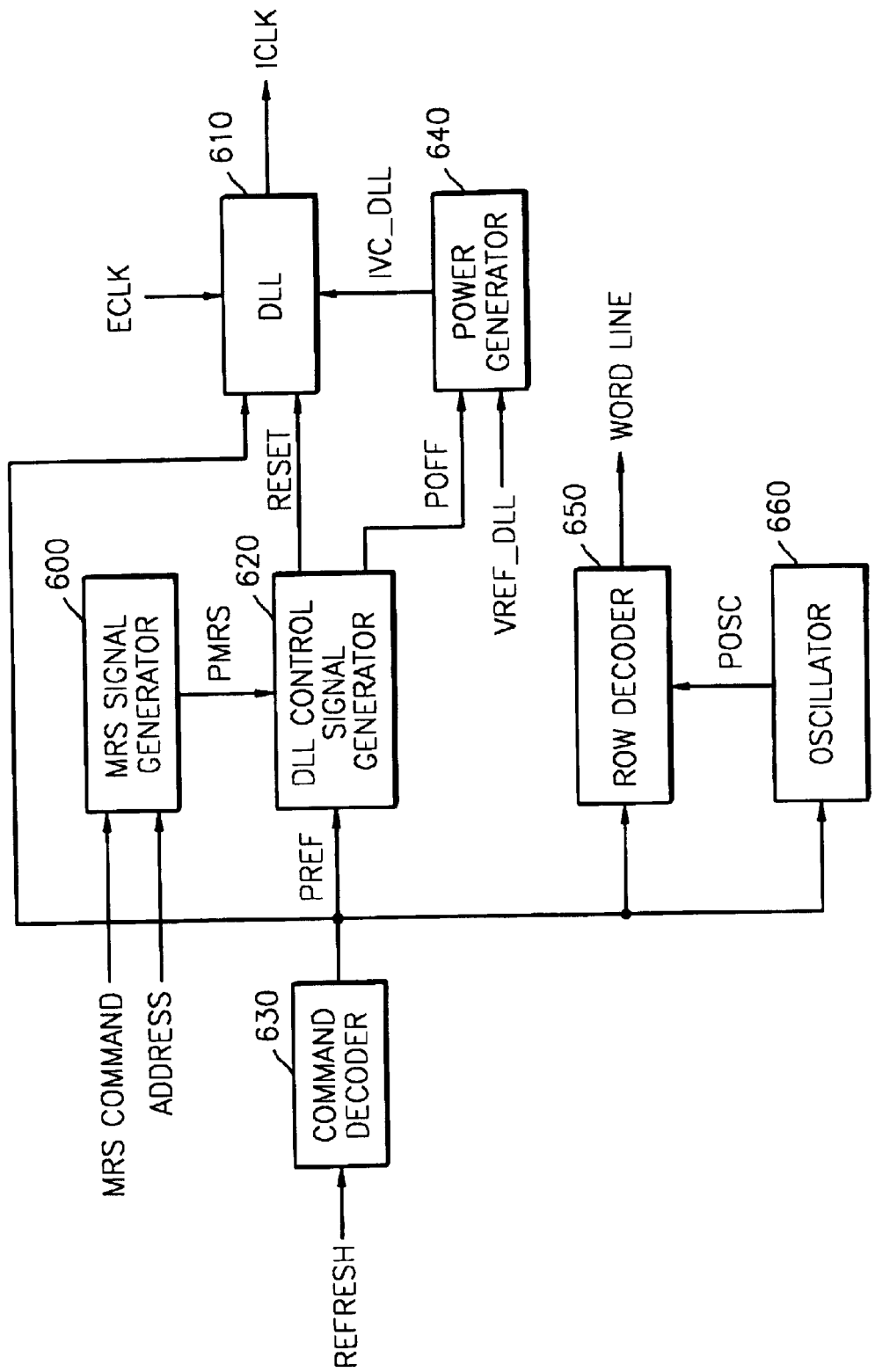
FIG. 1 illustrates a portion of a semiconductor memory device according to an embodiment of the present invention that includes a delay locked loop (DLL) circuit.

FIG. 1 illustrates a portion of a semiconductor memory device according to an embodiment of the present invention that includes a delay locked loop (DLL) circuit. As shown, the semiconductor memory device includes a mode register set (MRS) signal generator 600 that generates a selection signal PMRS based on an MRS command and a key address. In this manner, the MRS signal generator 600 operates as a selection signal generator. As is well known, an MRS command is a command associated with a predetermined set of signals applied to one or pins of the semiconductor memory device. Also, as is well-known, the use of a key address in association with MRS commands allows for an expanded set of MRS commands. In this embodiment of the present invention, the selection signal PMRS operates as a selection signal indicating whether power should be supplied to a DLL circuit 610 of the semiconductor memory device during a refresh mode. Also, the selection signal PMRS indicates whether the locking information in the DLL circuit 610 should be reset.

Figure 2:
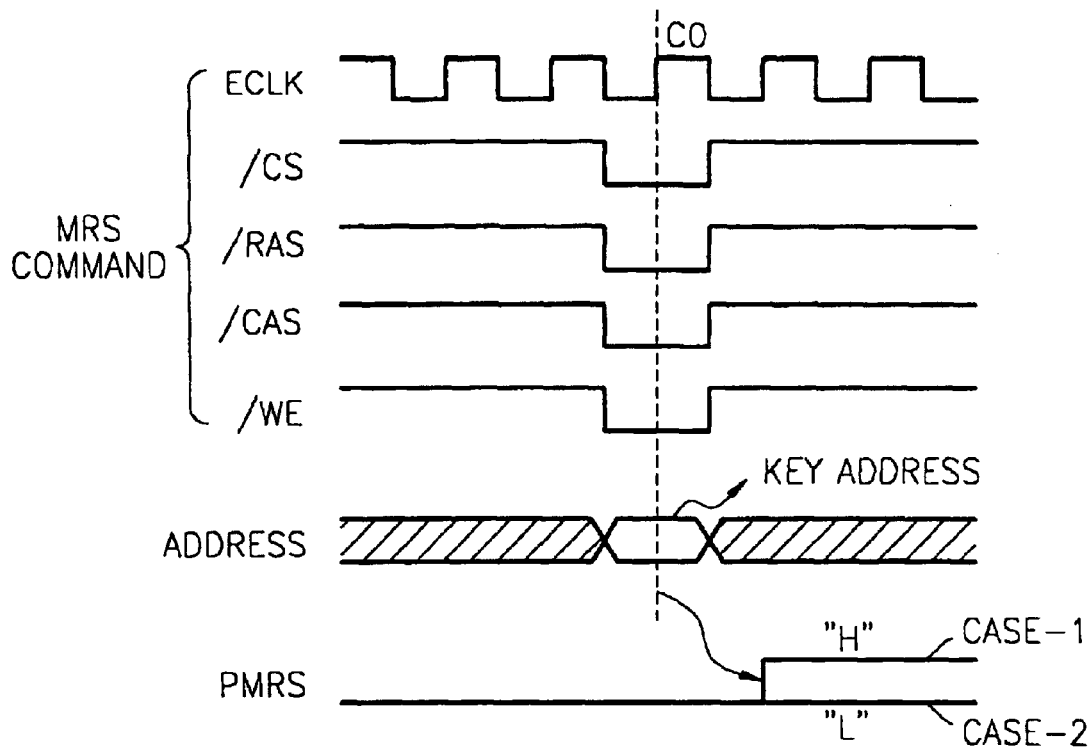
FIG. 2 illustrates one example of the MRS command that causes the MRS signal generator in FIG. 1 to generate the selection signal PMRS.

FIG. 2 illustrates one example of the MRS command that causes the MRS signal generator 600 to generate the selection signal PMRS. As shown, MRS command includes a chip select pin/CS, a row address strobe pin/RAS, a column address strobe pin/CAS, and a write enable pin/WE. At the rising edge of an externally supplied clock signal ECLK, when the MRS command is input, the MRS signal generator 600 determines whether to generate a logic high or logic low selection signal PMRS based on the key address supplied. In this embodiment of the present invention, a logic high selection signal PMRS indicates to supply power to the DLL circuit 610 and not to reset the DLL circuit 610 during a refresh operation. A logic low selection signal indicates to cease supplying power to the DLL circuit 610 and to reset the DLL circuit 610 during the refresh operation.

A command decoder 630 in the semiconductor memory device of FIG. 1 operates in a similar manner to generate an internal refresh signal PREF. Namely, based on a refresh entrance command asserted by applying a predetermined set of signals to pins of the semiconductor memory device, the command decoder 630 generates, for example, a logic high internal refresh signal PREF to indicate the semiconductor memory device is in the refresh mode. When a refresh exit command is asserted by applying another predetermined set of signals to pins of the semiconductor memory device, the command decoder 630 generates, for example, a logic low internal refresh signal PREF to indicate the semiconductor memory device is not in the refresh mode.

In response to the internal refresh command indicating a refresh mode, an oscillator 660 generates an oscillating signal POSC. A row decoder 650, in response to the internal refresh signal PREF indicating the refresh mode, sequentially activates word lines of the semiconductor memory device in synchronization with the oscillating signal POSC until the refresh mode terminates.

A DLL control signal generator 620 receives the selection signal PMRS and the internal refresh signal PREF, and generates a reset signal RESET and a power control signal POFF. The reset signal RESET indicates whether the DLL 610 should reset the locking information. The power control signal POFF indicates whether a power generator 640 should cease supplying power to the DLL circuit 610.

Figure 3:
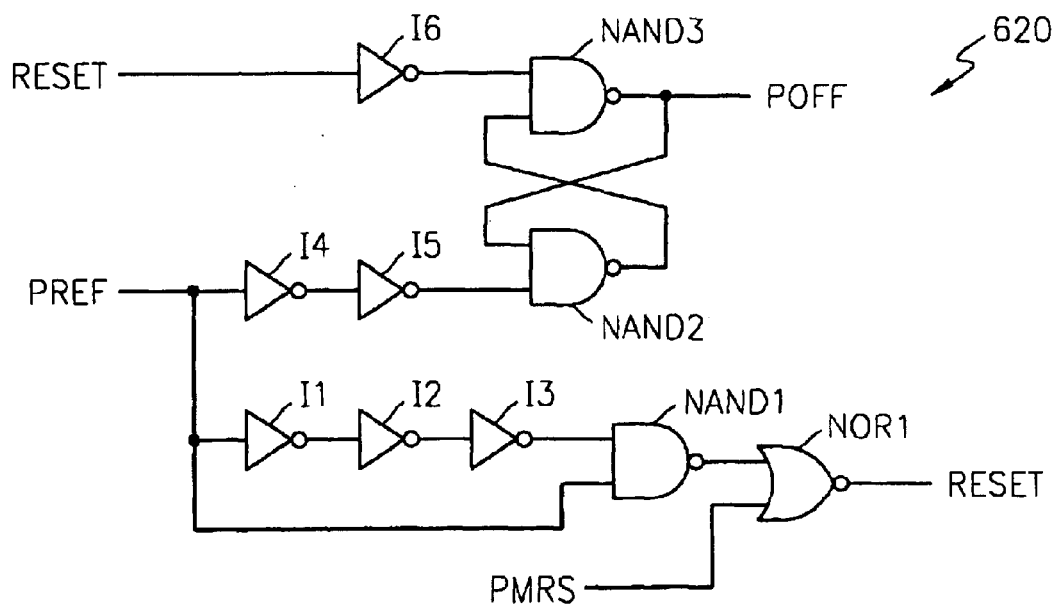
FIG. 3 illustrates an exemplary embodiment the DLL control signal generator in FIG. 1.

FIG. 3 illustrates a circuit diagram of the DLL control signal generator 620. As shown, the DLL control signal generator 620 includes first—third inverters I1–I3 connected in series to one input of a first NAND gate NAND1. The first inverter I1 receives the internal refresh signal PMRS at its input, and the first NAND gate NAND1 receives the internal refresh signal PREF at its other input. A first NOR gate NOR1 inputs the output of the first NAND gate NAND1 and the selection signal PMRS, and generates the reset signal RESET.

A fourth inverter I4 connected in series with a fifth inverter I5 to an input of a second NAND gate NAND2 also receives the internal refresh signal PREF. The second NAND gate NAND2 is cross-connected to a third NAND gate NAND3. A sixth inverter I6 inputs the reset signal RESET, and has its output connected to the other input of the third NAND gate NAND3. The third NAND gate NAND3 generates the power control signal POFF.

The initial states of the reset signal RESET, the power control signal POFF and the internal refresh signal PREF are logic low. Assuming the internal refresh signal PREF goes logic high during the refresh mode and the selection signal PMRS is logic low (indicating to cease the supply of power and to reset the locking information in the DLL circuit 610), then the reset signal RESET becomes logic high, and then the power control signal POFF becomes logic high. Assuming the internal refresh signal PREF goes logic high during the refresh mode and the selection signal PMRS is logic high (indicating to maintain power and to retain the locking information in the DLL circuit 610), then the reset signal RESET and the power control signal POFF are logic low.

Figure 4:
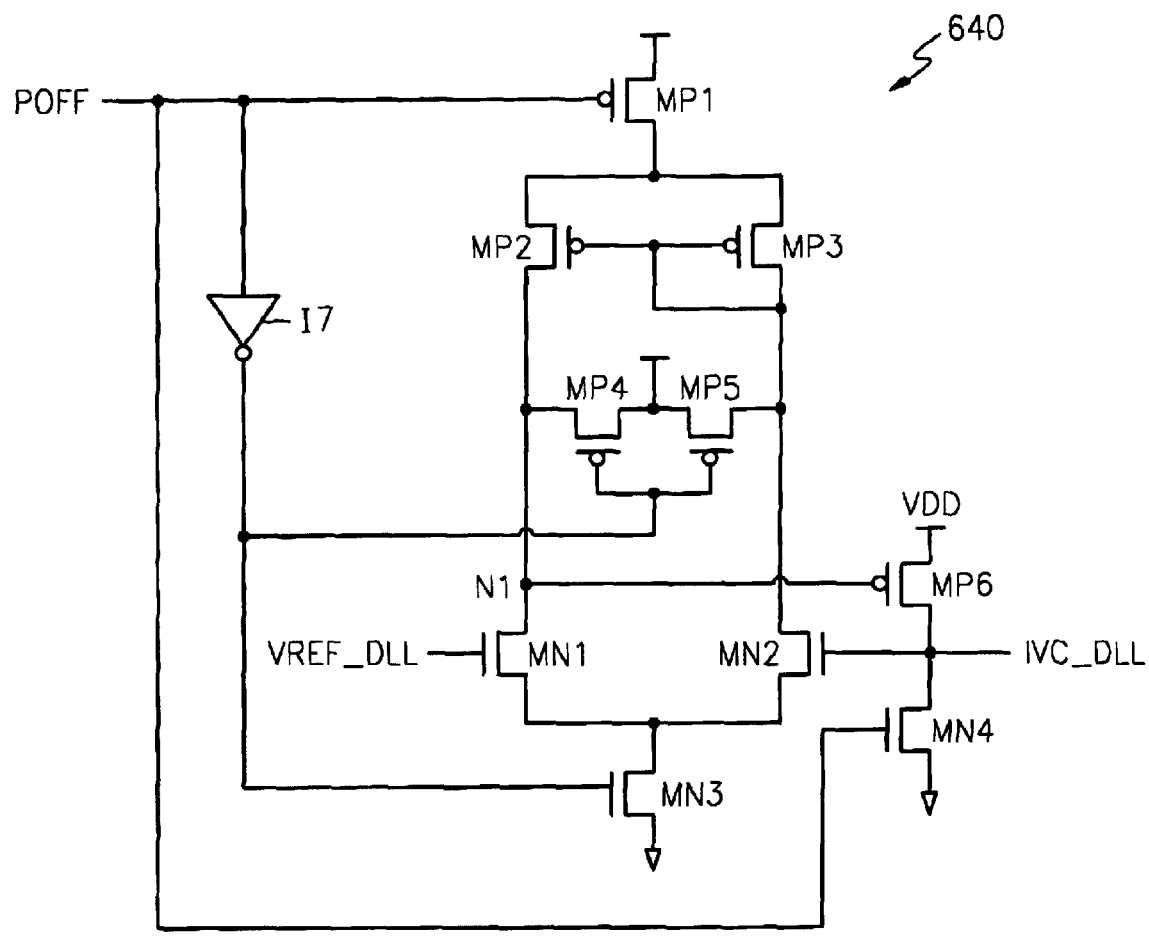
FIG. 4 illustrates an exemplary embodiment of the power generator in FIG. 1.

Returning to FIG. 1, the power generator 640 receives a reference voltage VREF and the power control signal POFF, and provides a power supply IVC to the DLL circuit 610. FIG. 4 illustrates an embodiment of the power generator 640. As shown, the power generator 640 includes a first PMOS transistor MP1 connected between a power supply voltage VDD and parallel second and third PMOS transistors MP2 and MP3. Fourth and fifth PMOS transistors MP4 and MP5 are connected to each other and respectively connected to the second and third PMOS transistors MP2 and MP3. First and second NMOS transistors MN1 and MN2 are respectively connected between the second and third PMOS transistors MP2 and MP3 and a third NMOS transistor MN3. The third NMOS transistor MN3 is further connected to ground.

The gate of the first PMOS transistor MP1 receives the power control signal POFF; the gates of the second and third PMOS transistors MP2 and MP3 are connected together and to the second NMOS transistor MN2; the gates of the fourth and fifth PMOS transistors MP4 and MP5 are connected together and receive an inverse of the power control signal POFF from a seventh inverter I7. The gate of the third NMOS transistor MN3 also receives the inverse of the power control signal POFF. The gate of the first NMOS transistor MN1 receives a reference voltage VREF, and the gate of the second NMOS transistor MN2 provides the power supply IVC to the DLL circuit 610.

The gate of the second NMOS transistor MN2 is also connected to a common node of the series connection of a sixth PMOS transistor MP6 with a fourth NMOS transistor MN4. The sixth PMOS transistor MP6 and fourth NMOS transistor MN4 are connected in series between the power supply voltage VDD and ground. The gate of the sixth PMOS transistor MP6 is connected to the common node N1 between the second PMOS transistor MP2 and the first NMOS transistor MN1. The gate of the fourth NMOS transistor MN4 receives the power control signal POFF.

The power generator 640 generates the power supply IVC based on the reference voltage VREF and the power control signal POFF. Assuming the power control signal POFF is logic low (indicating to supply power to the DLL circuit 610), then the power supply IVC is generated based on the reference voltage VREF. For instance, if the power supply IVC is less than the reference voltage VREF, the common node N1 becomes low and then the sixth transistor MP6 increases the power supply IVC which increases the supply of charge to the DLL circuit 610. Alternatively, if the power supply IVC is greater than the reference voltage VREF, the common node N1 becomes high and then the sixth transistor MP6 decreases the power supply IVC which decreases the supply of charge to the DLL circuit 610.

If the power control signal POFF is logic high, then the first PMOS transistor MP1 is turned off, the fourth and fifth PMOS transistors MP4 and MP5 are turned on, the third NMOS transistor MN3 is turned off, and the fourth NMOS transistor MN4 is turned on. The fourth NMOS transistor MN4, therefore, pulls the power supply IVC to ground. This terminates the power supply to the DLL circuit 610.

Returning to FIG. 1, the DLL circuit 610 receives the external clock signal ECLK, and generates an internal clock signal ICLK from the external clock signal ECLK. The DLL circuit 610 is powered by the power supply IVC supplied by the power generator 640. During the refresh mode, as indicated by the internal refresh signal PREF, the DLL circuit 610 ceases updating locking information stored in the DLL circuit 610 as described in more detail below. In addition, the DLL circuit 610 resets the locking information based on the reset signal RESET received from the DLL control signal generator 620.

Figure 5:
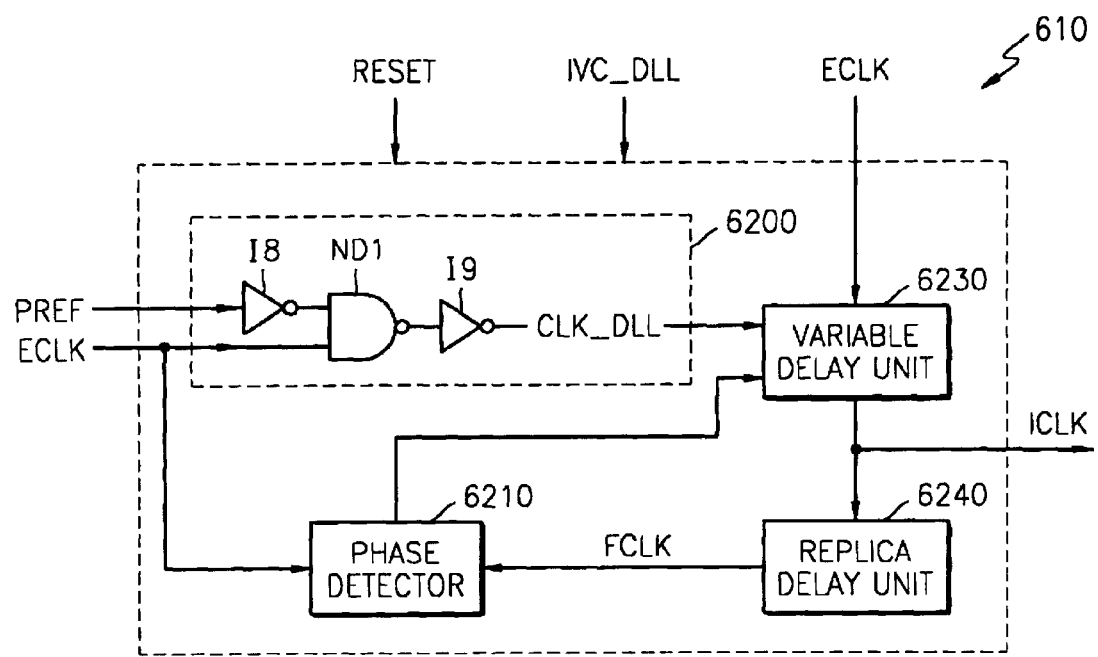
FIG. 5 illustrates an exemplary embodiment of the DLL circuit according to the present invention in FIG. 1.

FIG. 5 illustrates an embodiment of the DLL circuit 610 according to the present invention. As shown, the DLL circuit 610 includes a DLL clock generator 6200 generating a DLL clock signal CLK_DLL from the external clock signal ECLK and the internal refresh signal PREF. As is well-known, a variable delay unit 6230, described in detail below with respect to FIG. 6, delays the DLL clock signal CLK_DLL based on phase information received from a phase detector 6210 to generate the internal clock signal ICLK. Optionally, a well-known, replica delay unit 6240 delays the internal clock signal ICLK prior to its receipt as a feedback clock signal FCLK by the phase detector 6210.

The replica delay unit 6240 replicates, for example, data output buffer delay (not shown) such that the phase detector 6210 receives accurate information on the phase relationship between the internal clock signal ICLK and the external clock signal ECLK. As is further well-known, the phase detector 6210 detects a phase difference between the external clock signal ECLK and the representation of the internal clock signal ICLK in the form of the feedback clock signal FCLK. The phase detector 6210 outputs the phase difference information to the variable delay unit 6230.

As shown in detail in FIG. 5, the DLL clock generator 6200 includes an inverter I8 inverting the internal refresh signal PREF; a NAND gate ND1 NANDing the inverted internal refresh signal output from the inverter I8 with the external clock signal ECLK; and an inverter I9 inverting the output of the NAND gate ND1. As will be appreciated, when the internal refresh signal PREF is logic low indicating the semiconductor memory device is not in the refresh mode, the external clock signal ECLK is output as the DLL clock signal CLK_DLL. When the internal refresh signal PREF is logic high indicating the semiconductor memory device is in the refresh mode, the DLL clock signal CLK_DLL remains a steady state of logic low regardless of the state of the external clock signal ECLK. In this manner, the DLL clock generator 6200 serves as a disabling circuit disabling the function of the variable delay unit 6230.

Figure 6:
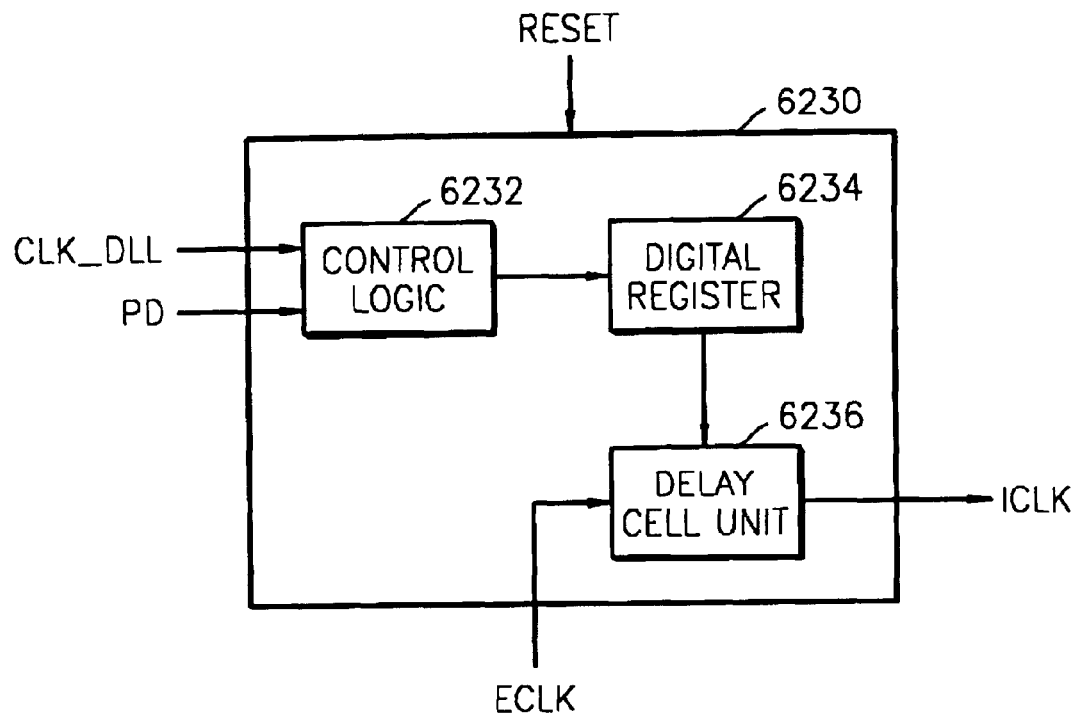
FIG. 6 partially illustrates the variable delay unit of the DLL circuit in greater detail.

FIG. 6 partially illustrates the well-known structure of the variable delay unit 6230 in greater detail. Because the variable delay unit 6230 is a well-known component, only those aspects of the variable delay unit 6230 that provide a greater appreciation of the present invention have been shown. As shown, control logic 6232 receives the DLL clock signal CLK_DLL and the phase difference information PD. The control logic 6232 generates state change information in the well-known manner based on the DLL clock signal CLK_DLL and the phase difference information. A digital register 6234 receives the state change information and changes state based on the state change information. The state stored in the digital register 6234 represents an amount of delay by which the external clock signal ECLK should be delayed to generate the internal clock signal ICLK. As will be appreciated, the state information in the digital register 6234 represents the locking information for the DLL circuit 610. The locking information is output as control information to a delay cell unit 6236. The delay cell unit 6236 delays the external clock signal ECLK by a delay amount indicated by the control information to generate the internal clock signal ICLK.

When reset, the digital register 6234 loads with a preprogrammed value representing a predetermined amount of delay. During operation, this value is increased and decreased based on the state change information from the control logic 6232. During a refresh operation, where the DLL circuit 610 is not reset, the DLL clock signal CLK_DLL remains at a logic low value. As a result, the control logic 6232 does not change the state change information, and the locking information in the digital register 6234 remains unchanged. Namely, the variable delay unit 6230 is disabled from adjusting the locking information.

Figure 7:
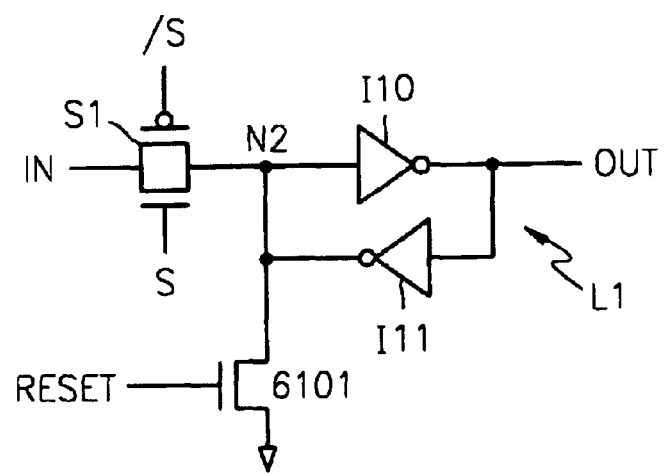
FIG. 7 illustrates an exemplary embodiment of initialization structure for an internal node in the DLL circuit.

The reset signal RESET, when indicating a reset operation, also initializes internal nodes of the DLL circuit 610. FIG. 7 illustrates an exemplary embodiment of initialization structure for an internal node, and the internal node may be disposed in the phase detector 6210, the replica delay unit 6240 and/or the variable delay unit 6230. As shown in FIG. 7, the initialization structure includes a pass gate S1 passing a signal based on a switch signal S and inverse switch signal/S to an internal node N2. The logic value of the passed signal is latched by a latch L formed of inverters I10 and I11. The inverse of the logic value of the internal node N2 is also, therefore, the output of the latch L. An NMOS transistor 6101 selectively connects the internal node N2 to ground based on the reset signal RESET. Namely, when the reset signal RESET is logic high, indicating a reset operation, the internal node is pulled to ground; thus initializing the internal node.

Figure 8:
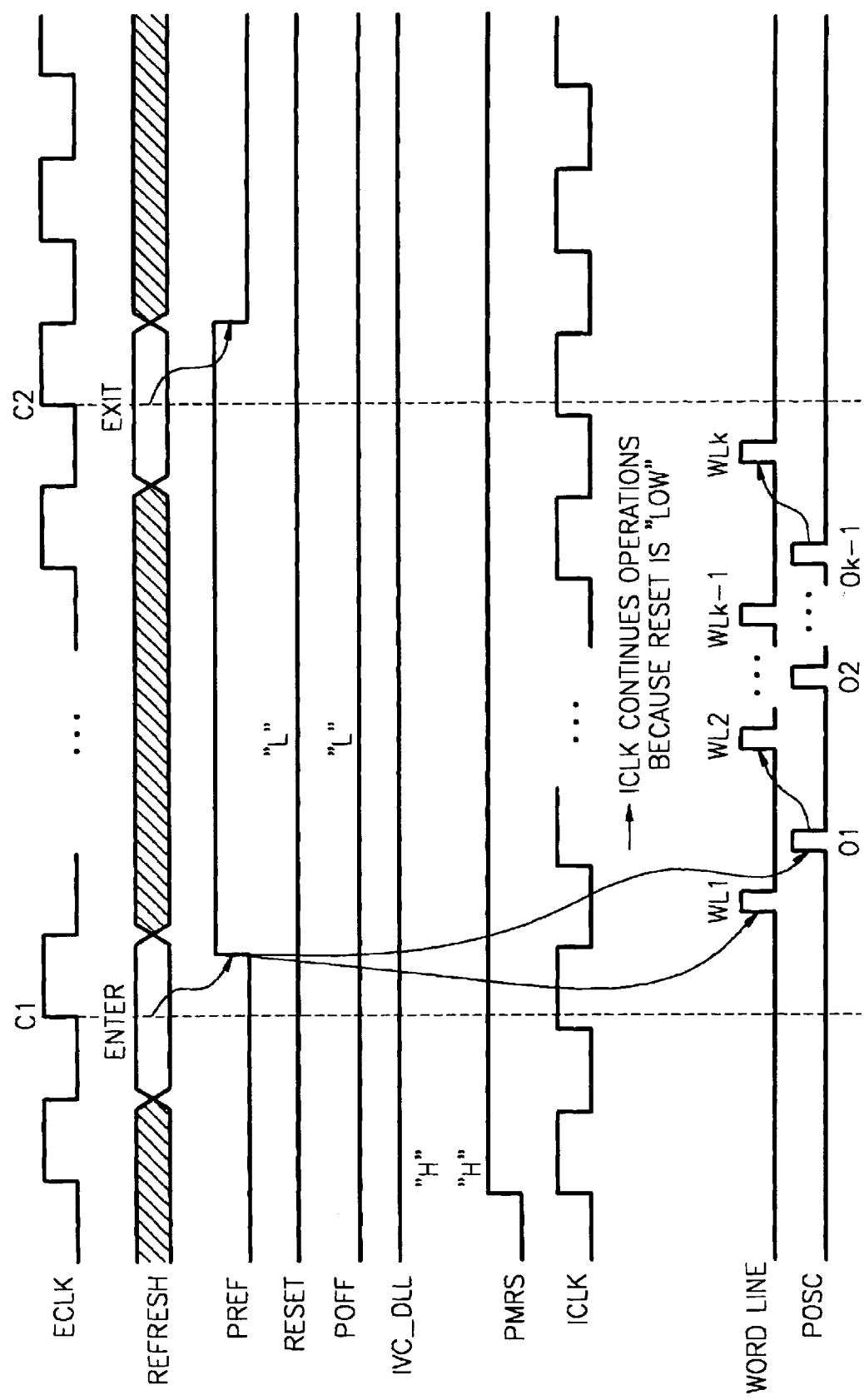
FIG. 8 illustrates timing diagrams for a first case where a refresh operation takes place, but the selection signal PMRS indicates that power to the DLL circuit should be maintained and no reset operation should take place.
Figure 9:
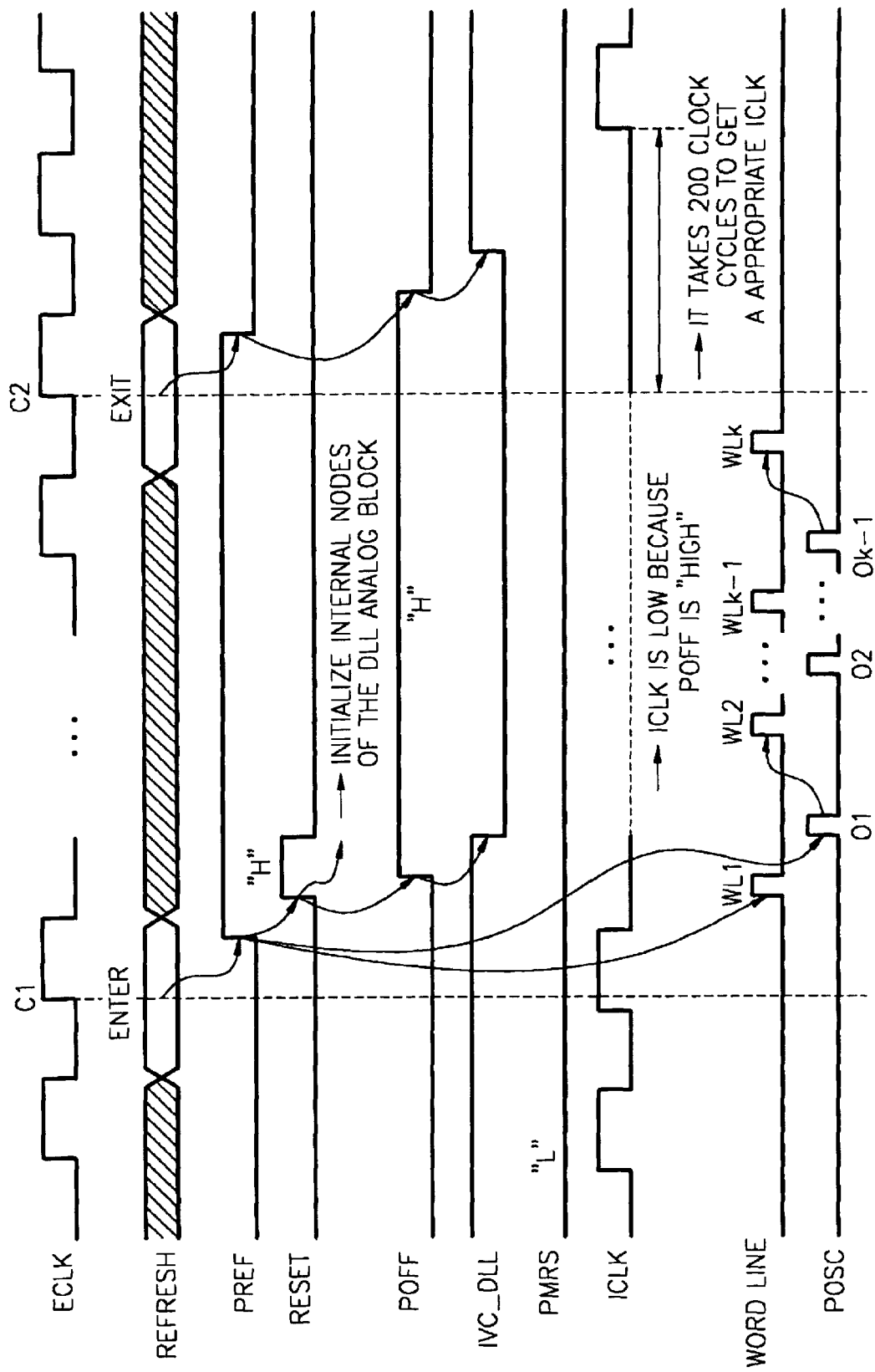
FIG. 9 illustrates the timing diagrams for a second case where a refresh operation takes place, and the selection signal PMRS indicates to cut power to the DLL circuit and to reset the DLL circuit.

Next the operation of this embodiment of the present invention will be reviewed with reference to FIGS. 8 and 9. FIG. 8 illustrates timing diagrams for a first case where a refresh operation takes place, but the selection signal PMRS indicates that power to the DLL circuit 610 should be maintained and no reset operation should take place. FIG. 9 illustrates the timing diagrams for a second case where a refresh operation takes place, and the selection signal PMRS indicates to cut power to the DLL circuit 610 and to reset the DLL circuit 610.

As shown in FIG. 8, if a refresh entrance command enters at clock cycle C1, refresh operations are performed from a certain starting word line WLj (j is a natural number). The oscillator 660 in FIG. 1 generates the oscillator signal POSC having pulses O1, O2, . . . , Ok-1. In this case the selection signal PMRS is initially set logic high, and remains high during the refresh operation. Accordingly, as shown, the reset signal RESET and the DLL power control signal POFF remain logic low. The DLL power supply voltage IVC continues high, and the DLL circuit 610 is not reset. In other words, the DLL circuit 610 is supplied with a certain power supply voltage despite the refresh entrance command, and the internal clock signal ICLK can be generated, albeit without updating of the locking information. If a refresh exit command enters at clock cycle C2, the refresh operation stops, and updating of the locking information resumes. However, the internal clock signal ICLK is almost immediately useful. Namely, more than 200 clock cycles are not required for the DLL circuit 610 to begin generating a useful internal clock signal ICLK as when the locking information is reset.

As mentioned above, FIG. 9 shows timing diagrams for the case where power is cut to the DLL circuit 610 and the DLL circuit 610 is reset during a refresh operation. As shown, if a refresh entrance command enters at clock cycle C1, refresh operations are performed from a certain starting word line WLj (j is a natural number). Here, the selection signal PMRS is logic low; and therefore, the reset signal RESET is set logic high, which results in the resetting of the locking information in the DLL circuit 610. Subsequent to the reset signal RESET going logic high, the DLL power control signal POFF is set logic high. As a result, the power supply voltage IVC is set a ground voltage such that the internal clock signal ICLK can not be generated. If a refresh exit command enters at clock cycle C2, the refresh operation stops, which means power is re-supplied to the DLL circuit 610. The internal clock signal ICLK is then generated in a minimum of 200 clock cycles delay time.

Figure 10:
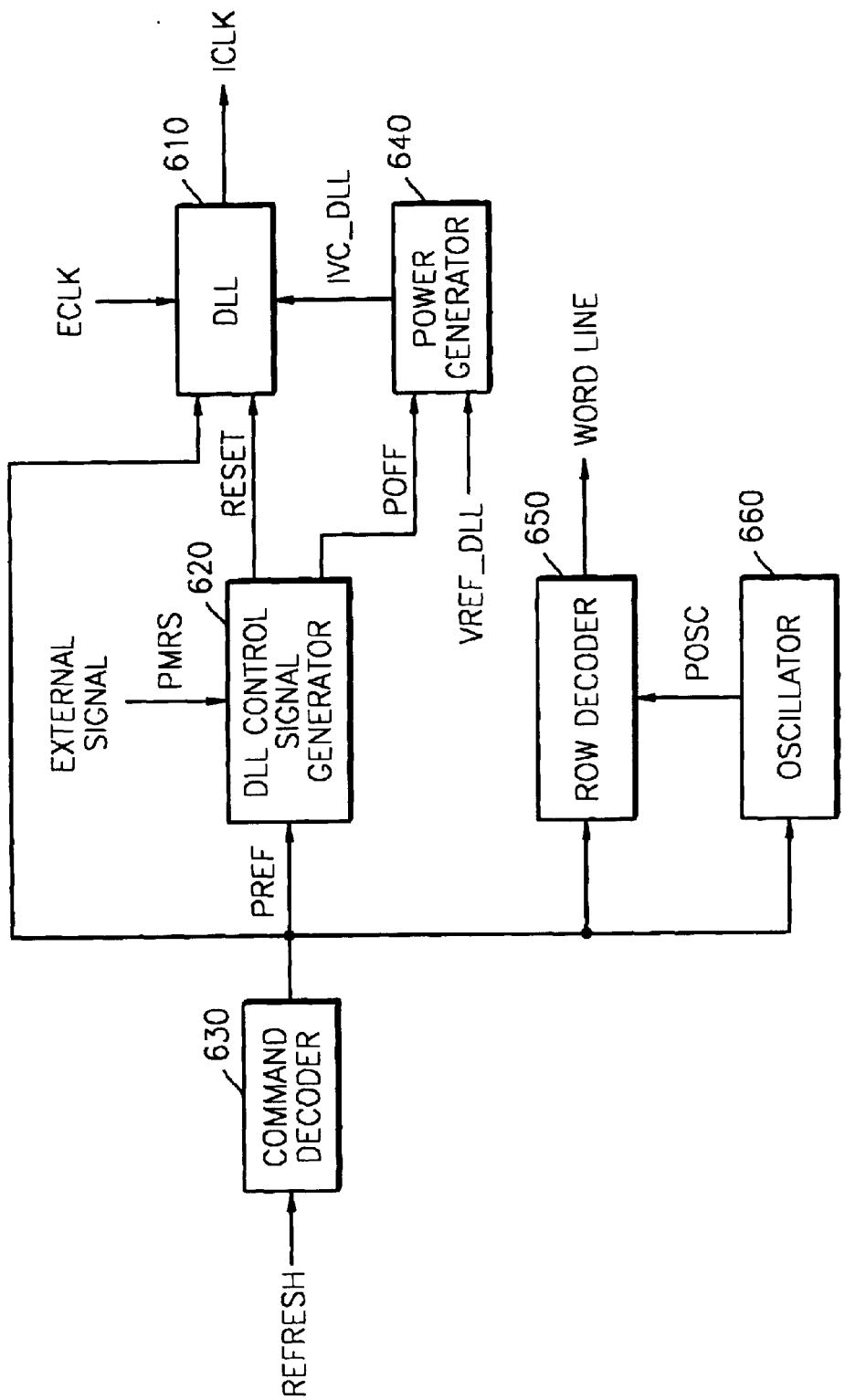
FIG. 10 illustrates a portion of a semiconductor memory device according to a second embodiment of the present invention that includes a DLL circuit.

FIG. 10 illustrates a portion of a semiconductor memory device according to a second embodiment of the present invention that includes a DLL circuit. This second embodiment of the present invention is the same as the first embodiment illustrated in FIG. 1, except that the embodiment of FIG. 2 does not include an MRS signal generator 600. Instead, the selection signal PMRS applied to the DLL control signal generator 620 is an externally supplied signal.

Figure 11:
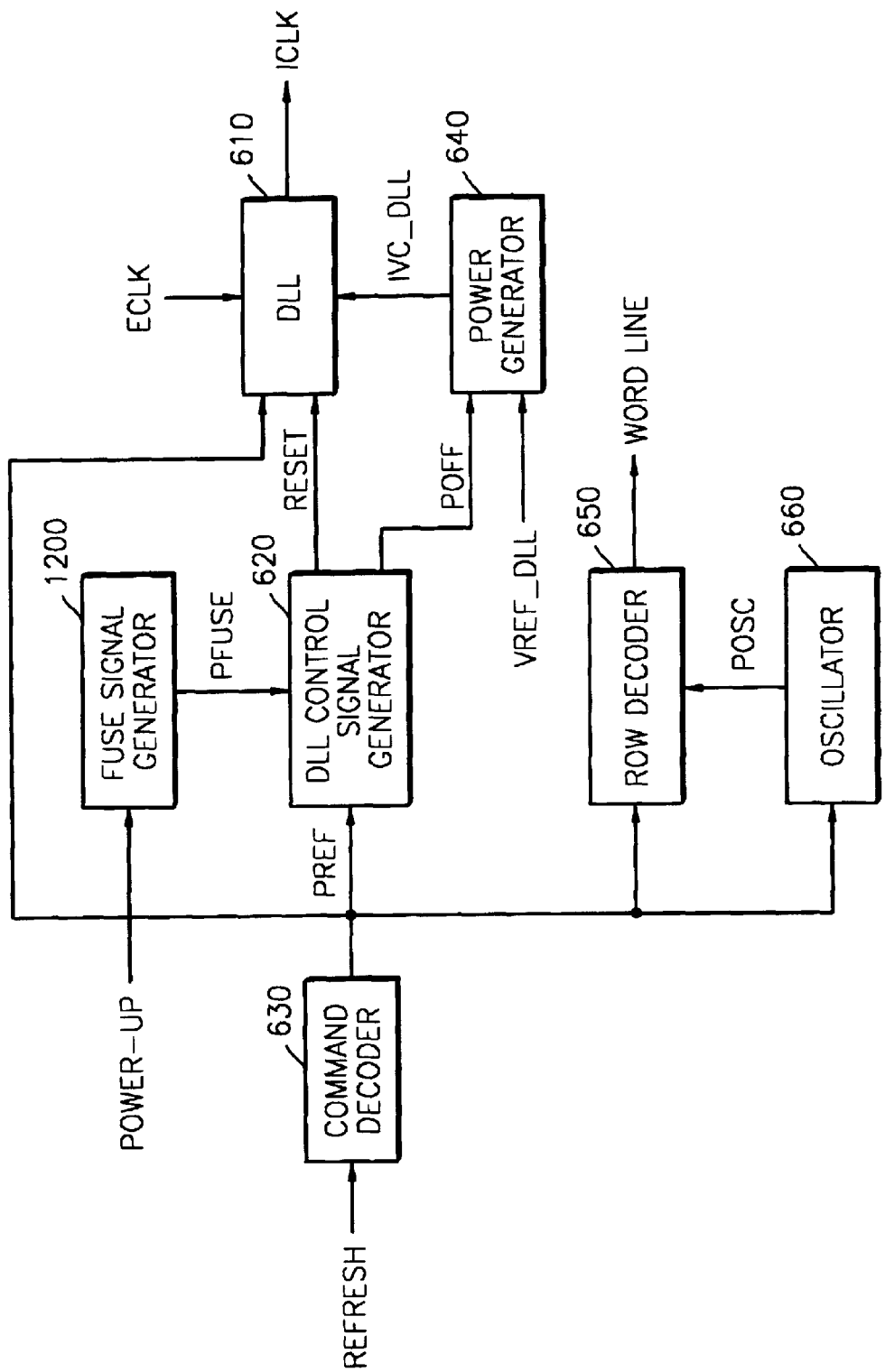
FIG. 11 illustrates a portion of a semiconductor memory device according to a third embodiment of the present invention that includes a DLL circuit.

FIG. 11 illustrates a portion of a semiconductor memory device according to a third embodiment of the present invention that includes a DLL circuit. This third embodiment is the same as the first embodiment illustrated in FIG. 1, except that the MRS signal generator 600 has been replaced with a fuse signal generator 1200. The fuse signal generator 1200 generates a logic high or logic low selection signal PFUSE based on the state of at least one fuse included therein.

Figure 12:
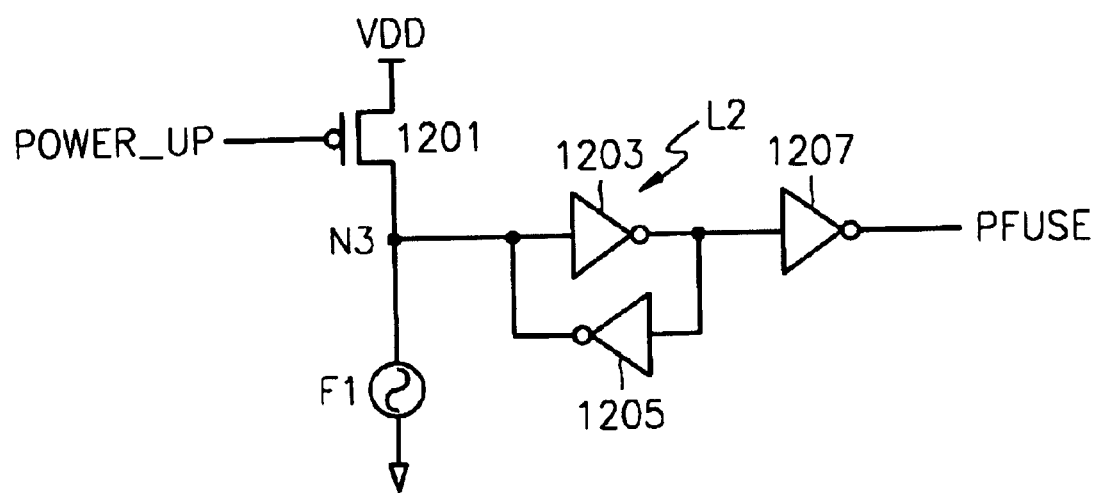
FIG. 12 illustrates an exemplary embodiment of the fuse signal generator in the third embodiment of the present invention.

FIG. 12 illustrates an exemplary embodiment of the fuse signal generator 1200. As shown, a PMOS transistor 1201 is connected in series with a fuse F1 between a supply voltage and ground. During power-up, the PMOS transistor 1201 receives a power-up signal at its gate that turns the PMOS transistor 1201 on. Assuming the fuse F1 is intact, an internal node N3 between the PMOS transistor 1201 and the fuse F1 attains a logic low value. This value is latched by a latch L2 formed from inverters 1203 and 1205. Another inverter 1207 inverts the output of the latch L2 to generate the selection signal PFUSE.

When the fuse F1 is intact, the selection signal PFUSE is logic low indicating that, during a refresh operation, power should be cut to the DLL circuit 610 and the DLL circuit 610 should be reset. However, when the fuse F1 is cut, the internal node N3 becomes logic high. Accordingly, the selection signal PFUSE is logic high indicating that, during a refresh operation, power should be supplied to the DLL circuit 610 and the DLL circuit 610 should not be reset.

Figure 13:
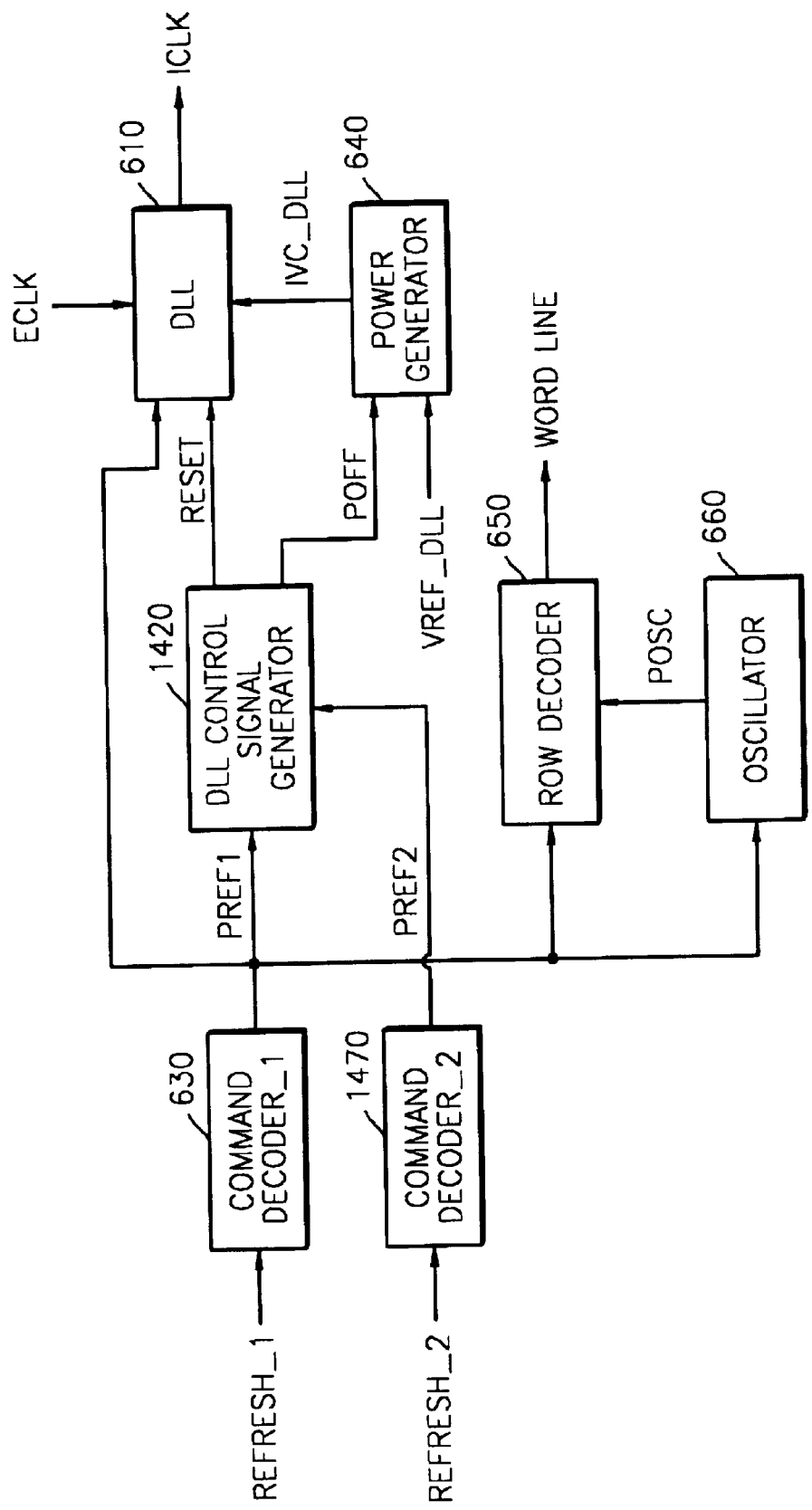
FIG. 13 illustrates a portion of a semiconductor memory device according to a fourth embodiment of the present invention that includes a DLL circuit.

FIG. 13 illustrates a portion of a semiconductor memory device according to a fourth embodiment of the present invention that includes a DLL circuit. This fourth embodiment is the same as the first embodiment illustrated in FIG. 1, except that the MRS signal generator 600 has been replaced with a second command decoder 1470 and the DLL control signal generator 620 has been replaced with a DLL control signal generator 1420. The second commend decoder 1470 receives a second refresh command and generates a second internal refresh signal PREF2 based on the second refresh command.

Figure 14:
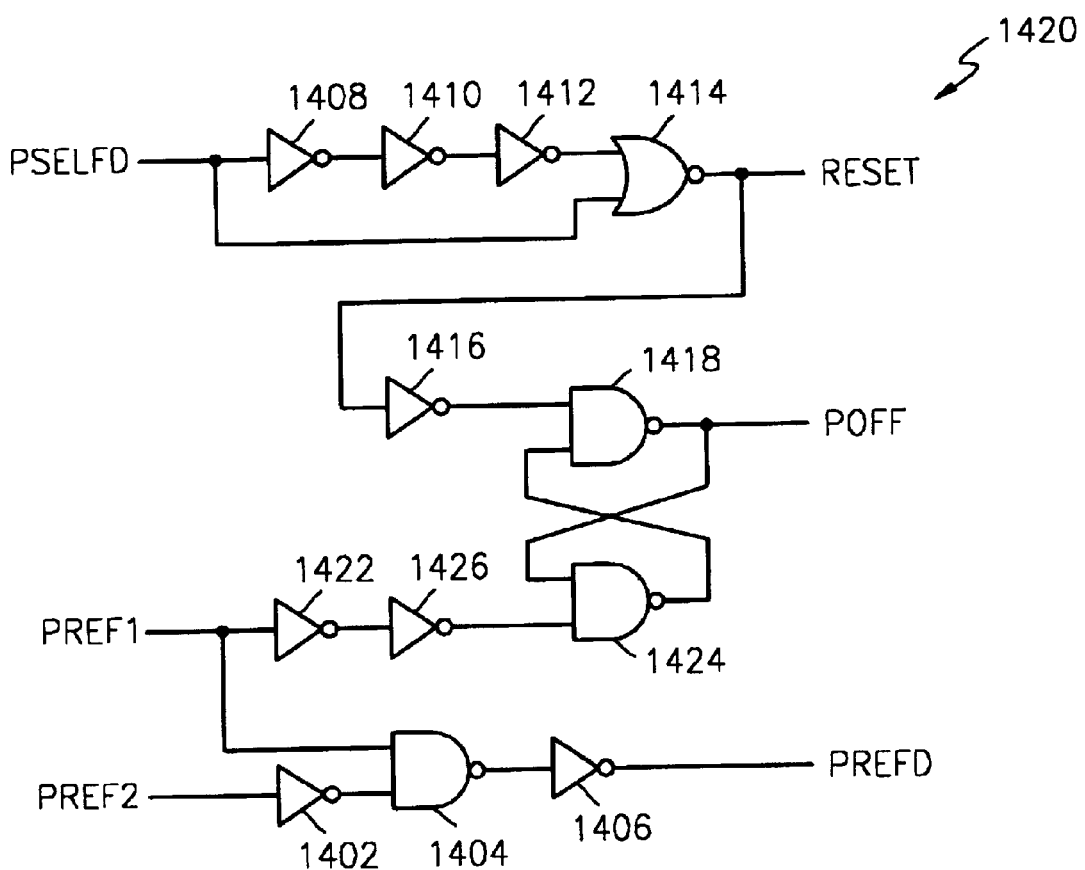
FIG. 14 illustrates an exemplary embodiment of the DLL control signal generator for the fourth embodiment of the present invention.

FIG. 14 illustrates an exemplary embodiment of the DLL control signal generator 1420 for the fourth embodiment of the present invention. As shown, an inverter 1402 inverts the second internal refresh signal PREF2, and a NAND gate 1404 NANDs the output of the inverter 1402 and the first internal refresh signal PREF1. An inverter 1406 inverts the output from the NAND gate 1404 to generate a delayed refresh signal PREFD. An inverter 1408 connected in series with inverters 1410 and 1412 inputs the delayed refresh signal PREFD. A NOR gate 1414 inputs the delayed refresh signal PREFD and the output of the inverter 1412, and outputs the reset signal RESET.

An inverter 1416 inverts the reset signal RESET. A NAND gate 1418 cross-coupled with a NAND gate 1424 inputs the output of the inverter 1416 and outputs the power control signal POFF. As further shown in FIG. 14, an inverter 1422, connected in series with an inverter 1426, inputs the first internal refresh signal PREF1. The inverter 1426 supplies the other input to the NAND gate 1424.

Figure 15:
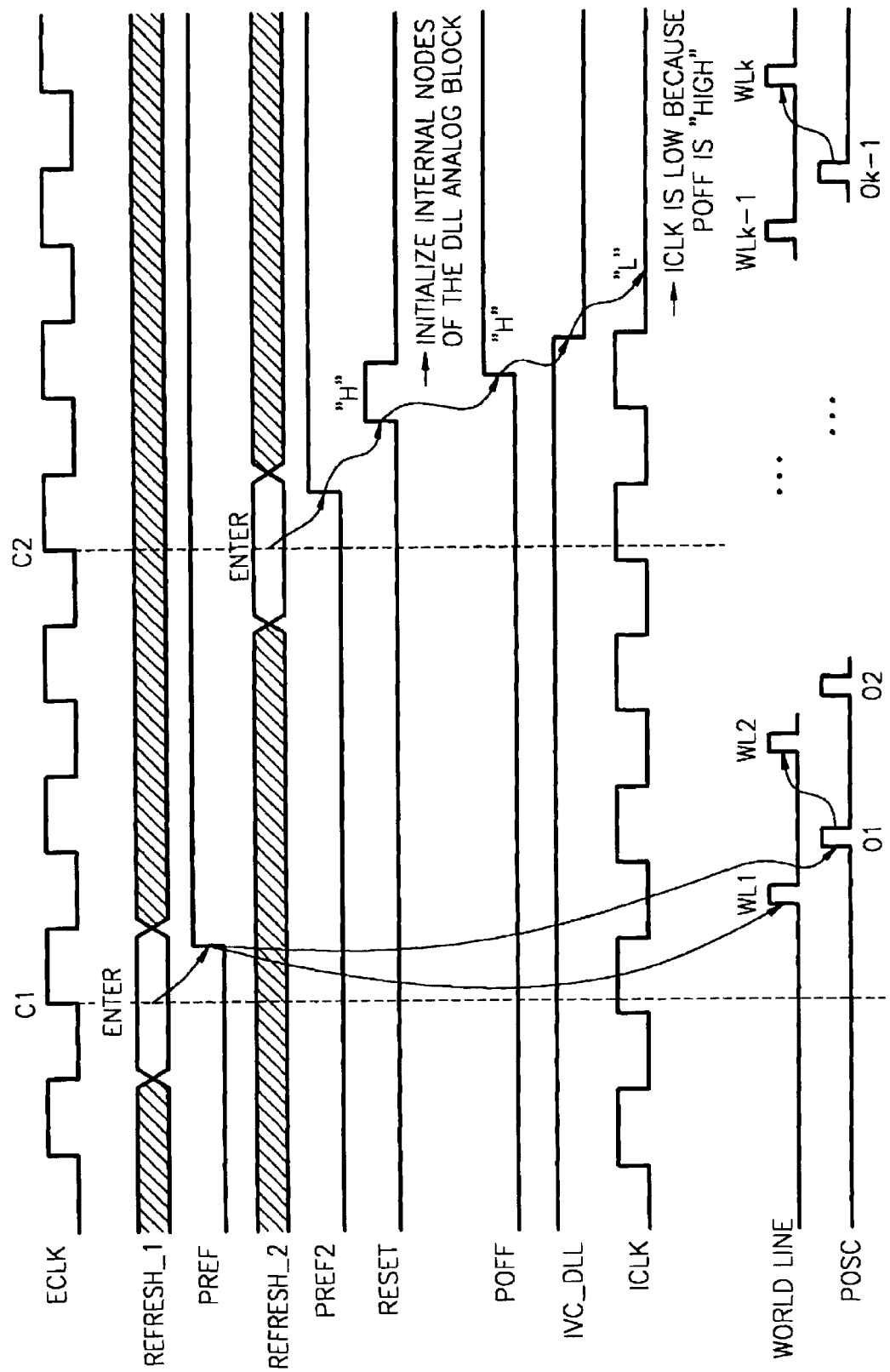
FIG. 15 illustrates a timing diagram of signals generated in the fourth embodiment.

The operation of the fourth embodiment and the DLL control signal generator 1420 will be described in more detail with respect to FIG. 15. FIG. 15 illustrates a timing diagram of signals generated in the fourth embodiment. As shown, at clock cycle C1, a first refresh command REFRESH_1 is input to the semiconductor memory device and a refresh operation starts. Namely, the oscillator 660 generates the oscillation signal POSC, and the word lines are sequentially activated. As is well-known, the order of the refresh operation for the word line signals are performed based on internal refresh counters (not shown).

If the second refresh command input REFRESH_2 is applied to the semiconductor memory device, the second internal refresh signal PREF2 is generated. Generation of the second internal refresh signal PREF2 results in the reset signal RESET pulsing logic high, which then causes the power control signal POFF to go logic high. As a result, the DLL circuit 610 is reset and then the supply of power to the DLL circuit 610 is cut. The internal clock signal ICLK becomes logic low when the power control signal POFF goes logic high. The second refresh command is called a DLL command because the DLL command generates a DLL indication signal indicating whether the DLL power supply is to supply power to the DLL circuit during the refresh mode. In other words, the DLL indication signal determines the state of turning on/off the DLL circuit.

Figure 16:
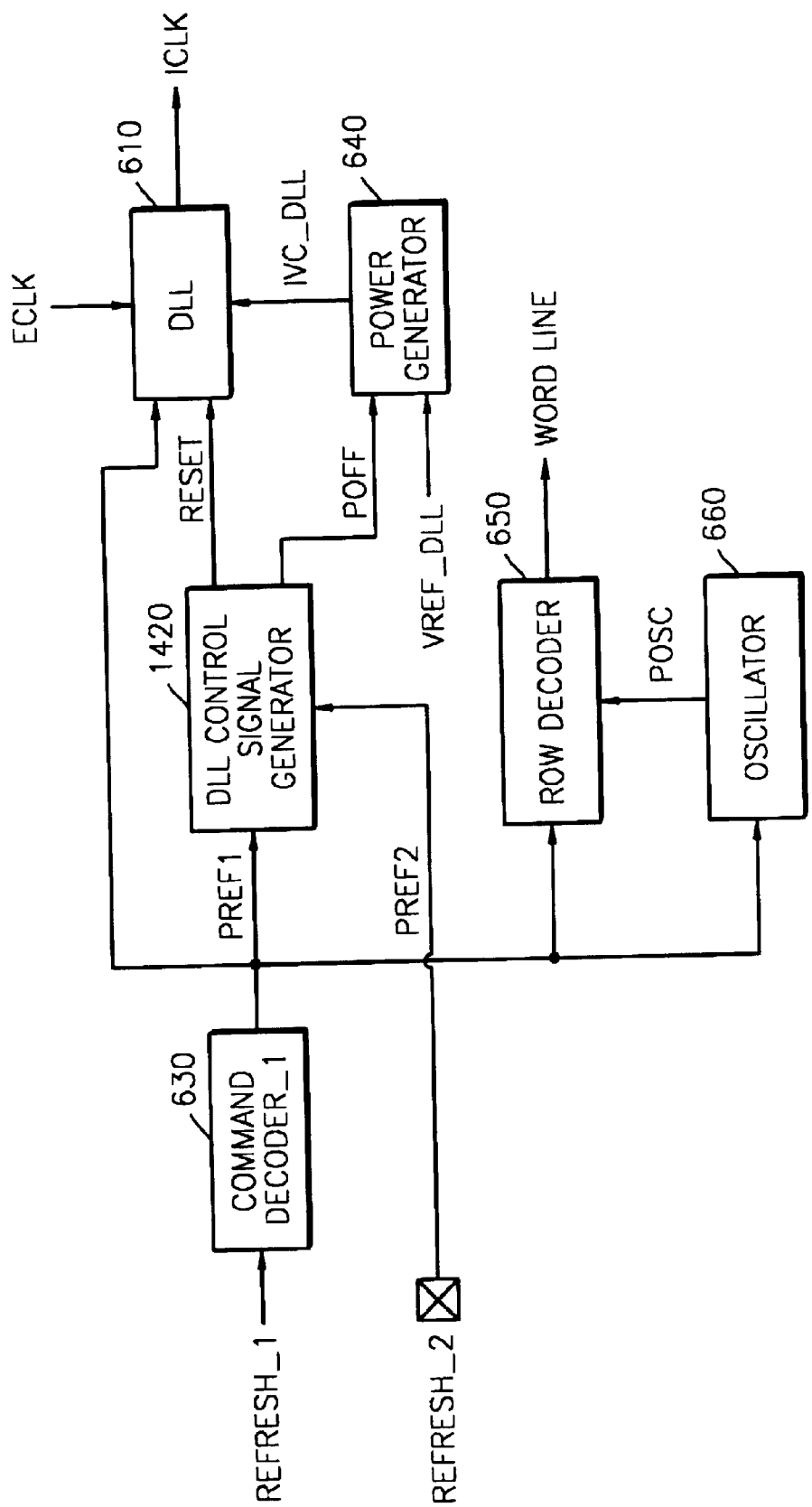
FIG. 16 illustrates a portion of a semiconductor memory device according to a fifth embodiment of the present invention that includes a DLL circuit.

FIG. 16 illustrates a portion of a semiconductor memory device according to a fifth embodiment of the present invention that includes a DLL circuit. This fifth embodiment of the present invention is the same as the fourth embodiment illustrated in FIG. 13, except that the embodiment of FIG. 14 does not include a second command decoder 1470. Instead, the second refresh signal PREF2 applied to the DLL control signal generator 1420 is an externally supplied signal.

Figure 17:
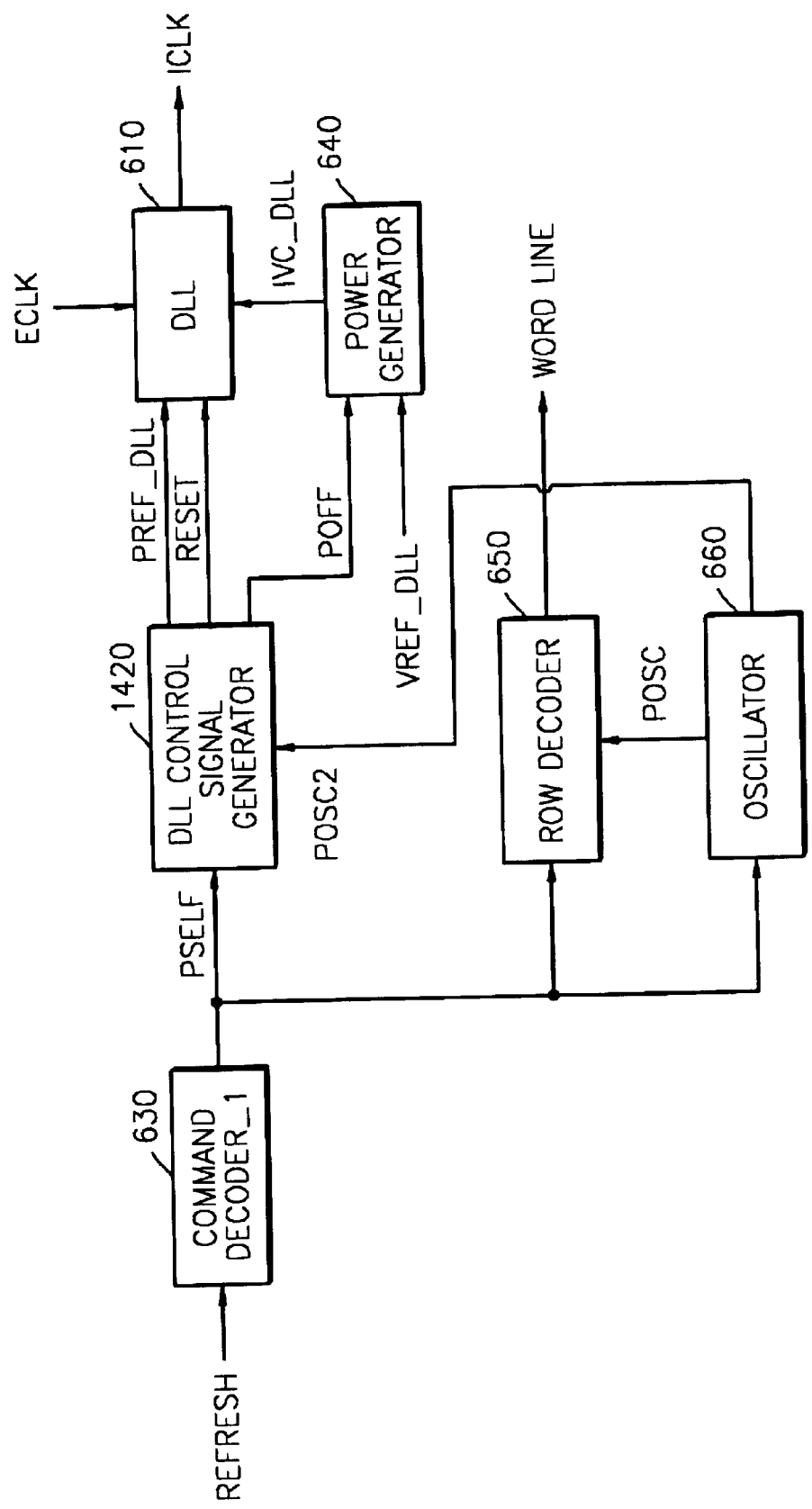
FIG. 17 illustrates a portion of a semiconductor memory device according to a sixth embodiment of the present invention that includes a DLL circuit.

FIG. 17 illustrates a portion of a semiconductor memory device according to a sixth embodiment of the present invention that includes a DLL circuit. This sixth embodiment of the present invention is the same as the fourth embodiment illustrated in FIG. 13, except that the embodiment of FIG. 17 does not include a second command decoder 1470 and the oscillator 660 has been replaced by an oscillator 1860. Besides generating the oscillation signal POSC, the oscillator 1860 also generates a second oscillation signal POSC2 that replaces the second internal refresh signal PREF2. Namely, the DLL control signal generator 1420 inputs the second oscillation signal POSC2 in the same manner that the second internal refresh signal PREF2 was input.

Figure 18:
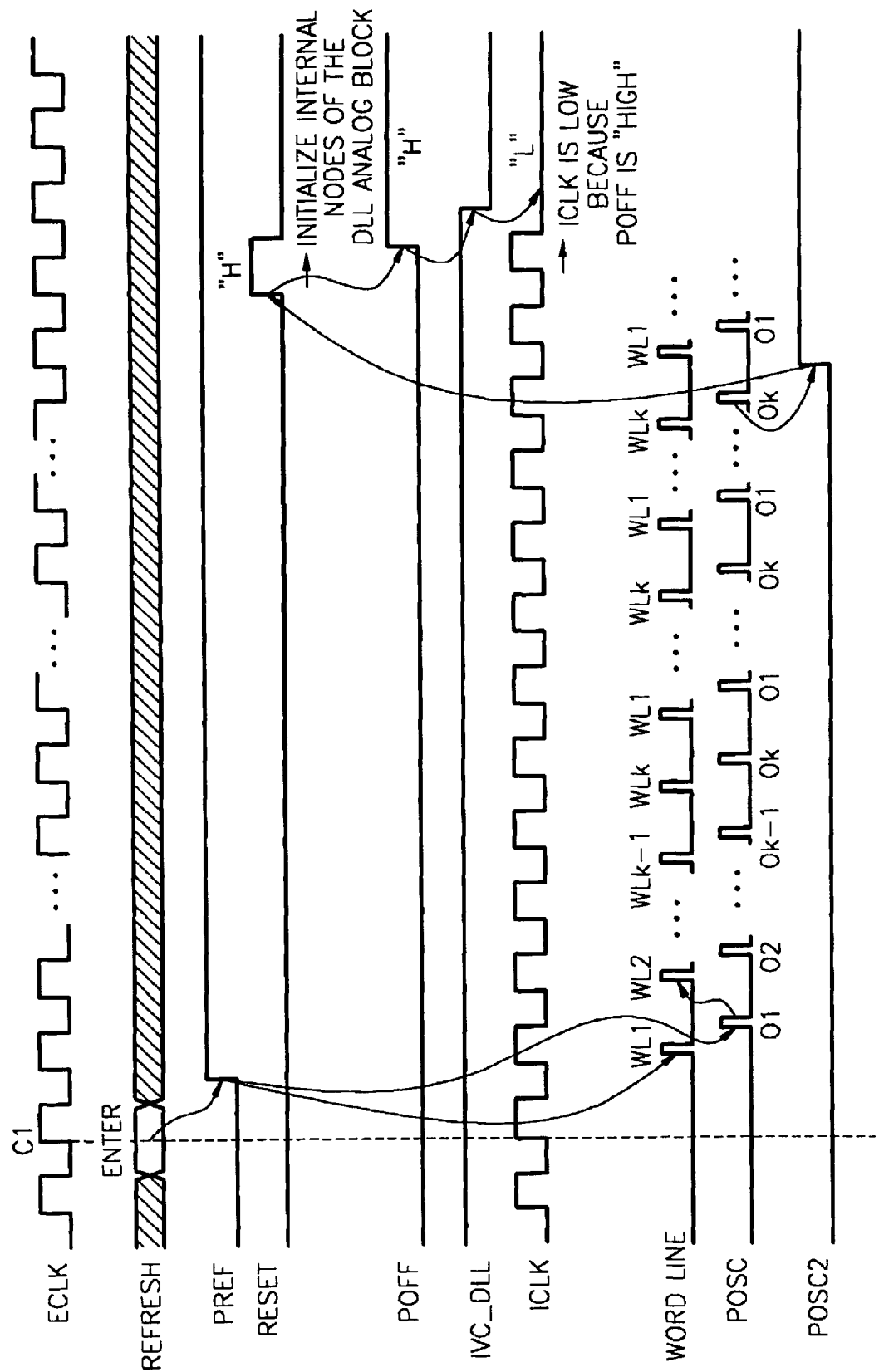
FIG. 18 illustrates a timing diagram of signals generated in the sixth embodiment.

One embodiment of operation for the sixth embodiment will be described in more detail with respect to FIG. 18. FIG. 18 illustrates a timing diagram of signals generated in the sixth embodiment. As shown, at clock cycle C1, a refresh command REFRESH is entered and then a refresh operation starts. Namely, the oscillator 1860 generates oscillation signal POSC, and the word lines are sequentially asserted. After at least one refresh operation passes (i.e., each word line is asserted), the second oscillation signal POSC2 is enabled. The number of the refresh cycles that occur before generating the second oscillation signal POSC2 is a design parameter set by the designer of the semiconductor memory device.

The enabling of the second oscillation signal POSC2 results in the generation of a logic high reset signal RESET. The reset signal RESET initializes (i.e., resets) the internal nodes of the DLL circuit 610. A power control signal POFF then transitions to logic high and causes the supply of power to the DLL circuit to be cut. This, in turn, results in the turns the internal clock signal ICLK going logic low.

The present invention discloses the selectable turning on/off of the DLL circuit during a refresh operation. The present invention further discloses turning-off of the DLL circuit after at least one refresh operation. Furthermore, when the DLL circuit remains powered, the DLL circuit retains the locking information. Accordingly, a reduction in power consumption or performance improvement can be selectably acquired by using the present invention.

While the invention has been disclosed with respect to a limited number of embodiments, those skilled in the art, having the benefit of this disclosure, will appreciate numerous modifications and variations there from. It is intended that all such modifications and variations fall within the spirit and scope of the invention.

What is claimed is:

1. An integrated circuit memory device, comprising:
   a delay locked loop (DLL) circuit;
   a DLL power supply supplying power to the DLL circuit; and
   a control signal generator controlling the DLL power supply to selectively supply power to the DLL circuit during a refresh mode of the integrated circuit memory device based on a selection signal.

2. The device of claim 1, wherein
   the DLL circuit generates a first clock signal based on a reference clock signal and locking information, the locking information being information on a phase relationship between the first clock signal and the reference clock signal; and
   the control signal generator further controls the DLL circuit to selectively reset the locking information during the refresh mode of the integrated circuit memory device based on the selection signal.

3. The device of claim 2, wherein the first clock signal is one of a feedback clock signal, feedback within the DLL circuit, and an internal clock signal generated by the DLL circuit.

4. The device of claim 2, wherein the DLL circuit comprises:
   a phase detector detecting a phase difference between the first clock signal and the reference clock signal;
   a variable delay circuit adjusting the locking information based on the phase difference, and delaying the reference clock signal to produce the first clock signal based on the locking information; and
   a disabling circuit disabling the adjusting function of the variable delay circuit during the refresh mode.

5. The device of claim 4, wherein the disabling circuit causes the reference clock signal to maintain a steady logic state during the refresh mode.

6. The device of claim 1, further comprising:
   a selection signal generator generating the selection signal based on a mode register set command received by the integrated circuit memory device.

7. The device of claim 1, wherein the selection signal is an externally supplied signal.

8. The device of claim 1, further comprising:
   a fuse circuit to generate the selection signal during the refresh mode.

9. The device of claim 1, further comprising:
   a first command decoder decoding a refresh command to generate a refresh mode indication signal indicating whether the integrated circuit memory device is in the refresh mode, and sending the refresh mode indication signal to the control signal generator and the DLL circuit.

10. The device of claim 9, further comprising:
   a second command decoder decoding a DLL command to generate a DLL indication signal indicating whether the DLL power supply is to supply power to the DLL circuit during the refresh mode, and sending the DLL indication signal to the control signal generator as the selection signal.

11. The device of claim 1, wherein the control signal generator initially controls the DLL power supply to supply power to the DLL circuit and then controls the DLL power supply to cut power to the DLL circuit.

12. The device of claim 1, wherein the DLL circuit generates a first clock signal based on a reference clock signal and locking information, the locking information being information on a phase relationship between the first clock signal and the reference clock signal;

the control signal generator controls the DLL circuit to selectively reset the locking information during the refresh mode of the integrated circuit memory device based on the selection signal; and the control signal generator initially controls the DLL circuit to maintain the locking information and then controls the DLL circuit to reset the locking information.

13. The device of claim 1, further comprising:

a row address decoder generating word line signals in sequence during the refresh mode based on an oscillating signal; and an oscillator generating the oscillating signal during the refresh mode.

14. The device of claim 13, wherein the oscillator generates the selection signal such that the control signal generator controls the DLL power supply to cut power to the DLL circuit at least one period of time after generating the oscillating signal.

15. The device of claim 14, wherein the period of time is a period of time for the row address decoder to generate each word line signal several times.

16. The device of claim 14, wherein the period of time is a period of time for the row address decoder to generate each word line signal once.

17. The device of claim 14, wherein the DLL circuit generates a first clock signal based on a reference clock signal and locking information, the locking information being information on a phase relationship between the first clock signal and the reference clock signal; and the control signal generator controls the DLL circuit to selectively reset the locking information during the refresh mode of the integrated circuit memory device based on the selection signal; and the oscillator generates the selection signal such that the DLL circuit is turned off a period of time after generating the oscillating signal.

18. The device of claim 1, wherein the DLL circuit is reset based on a reset signal; and the control signal generator selectively generates the reset signal during the refresh mode of the integrated circuit memory device.

19. A method of controlling a delay lock loop (DLL) circuit of an integrated circuit memory device, comprising:

controlling a DLL power supply to selectively supply power to the DLL circuit during a refresh mode of the integrated circuit memory device.

20. An integrated circuit memory device, comprising:

a delay locked loop (DLL) circuit receives an external clock signal and generates an internal clock signal;

wherein the DLL circuit is turned on during a first refresh operation and is turned off during a second refresh operation.

21. The device of claim 20, further comprising a selection signal generator for selecting a refresh operation between the first refresh operation and the second refresh operation.

22. The device of claim 21, wherein the selection signal generator generating a selecting signal.

23. The device of claim 22, wherein the selection signal is generated by programming means.

24. The device of claim 23, wherein the programming means is a mode register set command.

25. The device of claim 22, wherein the selection signal is input from an external pin.

26. The device of claim 22, wherein the selection signal is a fuse information signal.

27. An integrated circuit memory device, comprising:

a delay locked loop (DLL) circuit, the DLL circuit generates a first clock signal based on a reference clock signal and locking information, the locking information being information on a phase relationship between the first clock signal and the reference clock signal; and a control signal generator controlling the DLL circuit to selectively reset the locking information during a refresh mode of the integrated circuit memory device based on a selection signal.

28. The device of claim 27, wherein the control signal generator further controls the DLL circuit to cease updating the locking information and enter a power-off state.

* * * * *